United States Patent
Nicollini et al.

(10) Patent No.: US 10,056,892 B2
(45) Date of Patent: Aug. 21, 2018

(54) HIGH-SPEED CONTINUOUS-TIME COMPARATOR CIRCUIT

(71) Applicant: STMICROELECTRONICS S.R.L., Agrate Brianza (IT)

(72) Inventors: Germano Nicollini, Piacenza (IT); Roberto Modaffari, Pallanzeno (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/394,472

(22) Filed: Dec. 29, 2016

(65) Prior Publication Data

US 2018/0026618 A1    Jan. 25, 2018

(30) Foreign Application Priority Data

Jul. 21, 2016 (IT) .......................... 102016000076746

(51) Int. Cl.
| | |
|---|---|
| *H03K 5/24* | (2006.01) |
| *H03F 3/45* | (2006.01) |
| *G01R 19/00* | (2006.01) |

(52) U.S. Cl.
CPC ....... *H03K 5/2481* (2013.01); *G01R 19/0038* (2013.01); *H03F 3/45179* (2013.01); *H03F 3/45273* (2013.01)

(58) Field of Classification Search
None
See application file for complete search history.

(56) References Cited

U.S. PATENT DOCUMENTS

| | | | | |
|---|---|---|---|---|
| 6,211,712 | B1 | 4/2001 | Baik | |
| 6,771,126 | B2* | 8/2004 | Blankenship | ....... H03F 3/45183 330/257 |
| 7,576,610 | B2* | 8/2009 | Dalena | ................ H03F 3/45183 330/253 |
| 8,482,317 | B2* | 7/2013 | Ivanov | ................. H03K 5/2481 327/54 |
| 9,768,761 | B2* | 9/2017 | Huang | ................. H03K 5/2472 |
| 2002/0060607 | A1 | 5/2002 | Forejt | |
| 2013/0099825 | A1* | 4/2013 | Cheng | ................. H03K 5/2481 327/65 |

FOREIGN PATENT DOCUMENTS

WO       2006/034313 A1    3/2006

* cited by examiner

*Primary Examiner* — Patrick O'Neill
(74) *Attorney, Agent, or Firm* — Seed IP Law Group LLP

(57) ABSTRACT

A comparator circuit including: a first node and a second node, which receive a first current and a second current, respectively; a first current mirror, which includes a first load transistor and a first output transistor; and a second current mirror, which includes a second load transistor and a second output transistor. The comparator circuit further includes: a first feedback transistor and a second feedback transistor cross-coupled together, the control terminals of the first and second feedback transistors being connected to the first and second nodes, respectively; a first resistor, having a first terminal, which is connected to the control terminal of the first load transistor, and a second terminal, which is connected to the first node and to the control terminal of the first output transistor; and a second resistor, having a first terminal, connected to the control terminal of the second load transistor, and a second terminal, connected to the second node and to the control terminal of the second output transistor.

19 Claims, 2 Drawing Sheets

HIGH-SPEED CONTINUOUS-TIME COMPARATOR CIRCUIT

BACKGROUND

Technical Field

The present disclosure relates to a continuous-time comparator circuit of a high-speed type.

Description of the Related Art

As is known, today available are electronic circuits known as comparators, which are designed to compare an input signal, typically a voltage signal, with a reference signal, typically represented by a reference voltage, and to generate an output signal, which indicates the fact that the input signal is higher or lower than the reference signal.

In detail, comparators of the so-called clock-triggered type are known, in which the so-called decision of the comparator, i.e., switching of the output signal between a first value and a second value following upon crossing, by the input signal, of the voltage level represented by the reference voltage, takes place synchronously with a timing signal of a periodic type, generally known as clock signal. In particular, the decisions are made on the edges of the clock signal; typically, the decisions are made at the rising edges of the clock signal, whereas at the falling edges a reset is made.

In general, clock-triggered comparators make the respective decisions in very short times, since they implement latch mechanisms, which are characterized by a positive feedback. Consequently, clock-triggered comparators are characterized by a high speed and a high resolution; i.e., they are able to switch their own output signals following upon minimal deviations between the input signals and the reference voltages. However, clock-triggered comparators must in fact implement a circuitry of the reset latch type and further may not be used in the cases where it is necessary to monitor the input signal continuously.

In order to provide comparators capable of overcoming at least in part the drawbacks associated with clock-triggered comparators, comparators of a signal-triggered type have been proposed, which are also known as "continuous-time comparators", where the decision is taken at the moment when the input signal crosses a signal level equal to the level of the reference signal. In this case, the clock signal is not used, and the comparator continuously monitors the input signal.

In greater detail, FIG. 1 shows a continuous-time comparator circuit 1.

The comparator circuit 1 comprises a first MOSFET $M_1$, a second MOSFET $M_2$, a third MOSFET $M_3$, a fourth MOSFET $M_4$, a fifth MOSFET $M_5$, a sixth MOSFET $M_6$, a seventh MOSFET $M_7$, and an eighth MOSFET $M_8$, which operate in saturation regime. The comparator circuit 1 further comprises a current generator 2 designed to generate a current $I_{B0}$ of a d.c. type.

In detail, the first and second MOSFETs $M_1$, $M_2$ form a differential pair and are of the P-channel-enrichment type. In particular, the source terminals of the first and second MOSFETs $M_1$, $M_2$ are connected to a first terminal of the current generator 2, the second terminal of which is connected to a first node $N_1$, which in use is set at a supply voltage $V_{cc}$, for example, 3 V.

The gate terminals of the first and second MOSFETs $M_1$, $M_2$ form, respectively, a negative input terminal and a positive input terminal of the comparator circuit 1, which are designed to receive, respectively, the input signal and the reference signal (or vice versa), the latter signal being formed, for example, by a reference voltage.

The drain terminals of the first and second MOSFETs $M_1$, $M_2$ are connected, respectively, to the drain terminals of the third and fourth MOSFETs $M_3$, $M_4$, which are MOSFETs of the N-channel-enrichment type. More in particular, each one of the third and fourth MOSFETs $M_3$, $M_4$ is diode-connected. Consequently, the gate terminals of the third and fourth MOSFETs $M_3$, $M_4$ are connected, respectively, to the drain terminals of the third and fourth MOSFETs $M_3$, $M_4$; the gate terminals of the third and fourth MOSFETs $M_3$, $M_4$ are thus connected, respectively, to the drain terminals of the first and second MOSFETs $M_1$, $M_2$.

The source terminals of the third and fourth MOSFETs $M_3$, $M_4$ are connected to a second node $N_2$, which, in use, may be set at ground.

The fifth and sixth MOSFETs $M_5$, $M_6$ are of the N-channel-enrichment type. Further, the gate terminal and the source terminal of the fifth MOSFET $M_5$ are connected, respectively, to the gate terminal of the third MOSFET $M_3$ and to the second node $N_2$. The gate terminal and the source terminal of the sixth MOSFET $M_6$ are connected, respectively, to the gate terminal of the fourth MOSFET $M_4$ and to the second node $N_2$.

The seventh and eighth MOSFETs $M_7$, $M_8$ are of the P-channel-enrichment type.

The source terminals of the seventh and eighth MOSFETs $M_7$, $M_8$ are connected to the first node $N_1$. The gate terminals of the seventh and eighth MOSFETs $M_7$, $M_8$ are connected together.

The drain terminals of the seventh and eighth MOSFETs $M_7$, $M_8$ are connected, respectively, to the drain terminals of the fifth and sixth MOSFETs $M_5$, $M_6$. Further, the seventh MOSFET $M_7$ is diode-connected; consequently, the drain terminal and the gate terminal of the seventh MOSFET $M_7$ are connected together.

In greater detail, the first and second MOSFETs $M_1$, $M_2$ are the same as one another. The seventh and eighth MOSFETs $M_7$, $M_8$ are the same as one another. Further, the third and fourth MOSFETs $M_3$, $M_4$ are the same as one another; in addition, the fifth and sixth MOSFETs $M_5$, $M_6$ are the same as one another; these MOSFETs are such that the following relations apply: $(W/L)_{M5}=(W/L)_{M6}=k \cdot (W/L)_{M3}=k \cdot (W/L)_{M4}$, where $(W/L)_{M5}$, $(W/L)_{M6}$, $(W/L)_{M3}$ and $(W/L)_{M4}$ represent, respectively, the so-called W/L ratios for the channels of the fifth, sixth, third, and fourth MOSFETs $M_5$, $M_6$, $M_3$, $M_4$.

In practice, as mentioned previously, the first and second MOSFETs $M_1$, $M_2$ form the input transistors of a differential pair, the load transistors of which are formed by the third and fourth MOSFETs $M_3$, $M_4$. Further, the drain terminals of the sixth and eighth MOSFETs $M_6$, $M_8$ form a third node $N_3$, which represents an output node.

The comparator circuit 1 further comprises a cascade of inverters 6, which are connected in series, the input of the first inverter being connected to the third node $N_3$.

In practice, if $I_{B1}$ and $I_{B2}$ are, respectively, the currents that flow in the first and second MOSFETs $M_1$, $M_2$, respectively, the following relations apply:

$$I_{B1}=(I_{B0}/2)+\Delta$$

$$I_{B2}=(I_{B0}/2)-\Delta$$

where the $\Delta$ sign depends upon the relation between the input signal and the reference voltage. For instance, if the reference voltage, present on the gate terminal of the second MOSFET $M_2$, is higher than the input signal, present on the gate terminal of the first MOSFET $M_1$, $\Delta$ is positive; instead, if the reference voltage is lower than the input signal, $\Delta$ is negative.

The third and fifth MOSFETs $M_3$, $M_5$ form a first current mirror, so that flowing in the fifth MOSFET $M_5$ is a current $I^*$ equal to the current $I_{B1}$. Likewise, the fourth and sixth MOSFETs $M_4$, $M_6$ form a second current mirror, so that flowing in the sixth MOSFET $M_6$ is a current $I^{**}$ equal to the current $I_{B2}$.

The seventh and eighth MOSFETs $M_7$, $M_8$ form a third current mirror, so that flowing in the eighth MOSFET $M_8$ is a current $I^{***}$ equal to the current $I^*$, and thus to the current $I_{B1}$.

Operatively, the comparator circuit 1 functions as described in what follows, assuming that, following upon an instant (known as "crossing time") at which the input signal and the reference voltage assume one and the same value, the input signal assumes a value that differs from the value assumed at the crossing time and is such that $$I_{B1}=(I_{B0}/2)+\Delta$$

$$I_{B2}=(I_{B0}/2)-\Delta$$

with $\Delta$ positive; at the crossing time, $\Delta=0$. In practice, it is assumed that the input signal crosses the value of the reference voltage in its descending stretch.

This having been said, on account of the presence of the first, second, and third current mirrors, we have:

$$I^{***}=I_{B1}=(I_{B0}/2)+\Delta$$

$$I_{B2}=(I_{B0}/2)-\Delta$$

$$I^{**}=I_{B2}=(I_{B0}/2)-\Delta$$

Further, the voltage present on the drain terminal of the third MOSFET $M_3$ increases with respect to the corresponding value assumed at the crossing time, whereas the voltage present on the drain terminal of the fourth MOSFET $M_4$ decreases with respect to the corresponding value assumed at the crossing time. In this connection, the impedance seen by the drain terminal of the first MOSFET $M_1$ towards the second node $N_2$ is equal to $1/g_m$, where $g_m$ is the transconductance of the third MOSFET $M_3$. Also the impedance seen by the drain terminal of the second MOSFET $M_2$ towards the second node $N_2$ is equal to $1/g_m$ since it is assumed that the third and fourth MOSFETs $M_3$, $M_4$ are the same.

In addition, since in the eighth MOSFET $M_8$ there flows more current than in the sixth MOSFET $M_6$, the voltage on the third node $N_3$ tends to increase, going to a high value.

In the case where $\Delta$ were negative, i.e., in the case where the input signal were to cross the value of the reference voltage in the ascending stretch, the behavior of the comparator circuit 1 would be opposite to what has been described.

Switching of the voltage present on the third node $N_3$ from the low value to the value high (or vice versa) causes in succession switching of the outputs of the inverters 6 and thus represents a sort of preliminary output signal. Present on the output of the last inverter 6 is a voltage $V_{OUT}$, which forms the output signal of the comparator circuit 1. Switching of the voltage $V_{OUT}$, as also switching of the preliminary output signal, indicates crossing, by the input signal, of the voltage value indicated by the reference voltage, in addition to indicating the relation between the input signal and the reference voltage.

Irrespective of the presence of the inverters 6, the comparator circuit 1 is characterized in that it implements a sort of negative feedback. In fact, observing, for example, the first and third MOSFETs $M_1$, $M_3$, it may be noted how, if the voltage present on the drain terminal of the third MOSFET $M_3$ tends to increase on account of an increase in the current $I_{B1}$, also the voltage present on the gate terminal of the third MOSFET $M_3$ tends to increase. Since an increase in the voltage present on the gate terminal of the third MOSFET $M_3$ induces a reduction of the voltage present on the drain terminal of the third MOSFET $M_3$, the latter voltage is subject to a negative-feedback mechanism, as is also true for the voltage present on the drain terminal of the fourth MOSFET $M_4$. The comparator circuit 1 does not thus require any reset, but is characterized by relatively long times for switching of the voltage on the third node $N_3$. Further, the comparator circuit 1 has a relatively low gain; i.e., following upon the crossing time, it is necessary for the voltage of the input signal to differ from the reference voltage by a non-negligible deviation, for the comparator circuit 1 to carry out switching.

In order to speed up the response of the comparator, and in particular in order to speed up the variations of voltage on the third node $N_3$, the comparator circuit 10 illustrated in FIG. 2 has been proposed, which is described in what follows limitedly to the differences with respect to the comparator circuit 1. Further, components of the comparator circuit 10 already present in the comparator circuit 1 are designated by the same references.

In detail, the comparator circuit 10 comprises a ninth MOSFET $M_{3X}$ and a tenth MOSFET $M_{4X}$, referred to in what follows as the first feedback MOSFET $M_{3X}$ and the second feedback MOSFET $M_{4X}$, respectively.

The first and second feedback MOSFETs $M_{3X}$, $M_{4X}$ are of the N-channel-enrichment type and are the same as one another.

The drain and source terminals of the first feedback MOSFET $M_{3X}$ are connected, respectively, to the drain terminal of the third MOSFET $M_3$ and to the second node $N_2$. The gate terminal of the first feedback MOSFET $M_{3X}$ is connected to the drain terminal of the fourth MOSFET $M_4$ and thus also to the drain terminal of the second MOSFET $M_2$.

The drain and source terminals of the second feedback MOSFET $M_{4X}$ are connected, respectively, to the drain terminal of the fourth MOSFET $M_4$ and to the second node $N_2$. The gate terminal of the second feedback MOSFET $M_{4X}$ is connected to the drain terminal of the third MOSFET $M_3$, and thus also to the drain terminals of the first MOSFET $M_1$ and of the first feedback MOSFET $M_{3X}$. The gate terminal of the first feedback MOSFET $M_{3X}$ is thus connected also to the drain terminal of the second feedback MOSFET $M_{4X}$.

The first and second feedback MOSFETs $M_{3X}$, $M_{4X}$ implement a sort of positive feedback. In fact, assuming that we still have $$I_{B1}=(I_{B0}/2)+\Delta$$

$$I_{B2}=(I_{B0}/2)-\Delta,$$

with $\Delta$ positive, the increase in the voltage present on the drain terminal of the third MOSFET $M_3$, simultaneous to the decrease in the voltage present on the drain terminal of the fourth MOSFET $M_4$, causes increase of the voltage present on the gate terminal of the second feedback MOSFET $M_{4X}$, this increase tending to cause in turn an acceleration of the reduction in the voltage present on the drain terminal of the fourth MOSFET $M_4$. In an altogether specular or mirrored way, the reduction in the voltage present on the drain terminal of the fourth MOSFET $M_4$, simultaneous with the increase in the voltage present on the drain terminal of the third MOSFET $M_3$, tends to cause an acceleration of the increase of the voltage present on the drain terminal of the third MOSFET $M_3$.

In greater detail, the impedance seen from the drain terminal of the first MOSFET $M_1$ towards the second node $N_2$ is $$(g_m - g_{mx})^{-1}$$

where $g_{mx}$ is the transconductance of the first and second feedback MOSFETs $M_{3X}$, $M_{4X}$.

In even greater detail, the behavior of the comparator circuit 10 depends upon the transconductances $g_m$, $g_{mx}$, and thus upon the W/L ratios for the channels of the third and fourth MOSFETs $M_3$, $M_4$ and of the first and second feedback MOSFETs $M_{3X}$, $M_{4X}$. In particular, if $W/L_{(M3,M4)}$ is the ratio between the width and the length of the channel of one of the third and fourth MOSFETs $M_3$, $M_4$ and if $W/L_{(M3X,M4X)}$ is the ratio between the width and the length of the channel of one of the first and second feedback MOSFETs $M_{3X}$, $M_{4X}$, we have the following conditions:

- if $W/L_{(M3,M4)} > W/L_{(M3X,M4X)}$, the negative-feedback mechanism guaranteed by the third and fourth MOSFETs $M_3$, $M_4$, which are diode-connected, prevails over the positive-feedback mechanism represented by the first and second feedback MOSFETs $M_{3X}$, $M_{4X}$, which are cross-coupled; consequently, the comparator circuit 10 operates in a way similar to what has been described with reference to the comparator circuit 1, but with faster decision times and higher gain;
- if $W/L_{(M3,M4)} < W/L_{(M3X,M4X)}$, the positive-feedback mechanism prevails slightly over the negative-feedback mechanism; consequently, the comparator circuit 10 has a response with hysteresis and may not be used as continuous-time comparator; and
- if $W/L_{(M3,M4)} \ll W/L_{(M3X,M4X)}$, the positive-feedback mechanism prevails over the negative-feedback mechanism to the point where, once the comparator circuit 10 has carried out switching, it is no longer able to reset; consequently, also in this case the comparator circuit 10 may not be used as continuous-time comparator.

For practical purposes, the comparator circuit 10 enables continuous-time monitoring of the input signal and thus enables detection of the instant at which the input signal crosses the voltage level of the reference signal. However, the comparator circuit 10, and more in general continuous-time comparators, has a decision time, and thus a speed, that is less than clock-triggered comparators. Further, the resolution of the comparator circuit 10 is not particularly high.

BRIEF SUMMARY

Embodiments of the present disclosure provide a continuous-time comparator circuit that will overcome at least in part the drawbacks of the known art.

According to one embodiment of the present disclosure, a comparator circuit includes a first input node and a second input node configured to receive, respectively, a first current and a second current, which form a differential signal. The comparator circuit further includes a first current mirror having a first load transistor with a control terminal and a conduction terminal, and a first output transistor having a respective control terminal. The conduction terminal of the first load transistor is connected to the first node, the first output transistor being configured to be traversed by a first mirrored current that is a function of the first current. A second current mirror includes a second load transistor having a respective control terminal and a respective conduction terminal, and a second output transistor having a respective control terminal. The conduction terminal of the second load transistor is connected to the second node, and the second output transistor is configured to be traversed by a second mirrored current that is a function of the second current. A first feedback transistor has a respective conduction terminal and a respective control terminal, which are connected to the first node and to the second node, respectively. A second feedback transistor has a respective conduction terminal and a respective control terminal, which are connected to the second node and to the first node, respectively. Output circuitry, electrically coupled to the first and second output transistors is configured to generate an output signal that switches between a first value and a second value as a function of the first and second mirrored currents. A first resistor has a first terminal, which is connected to the control terminal of the first load transistor, and a second terminal, which is connected to the first node and to the control terminal of the first output transistor. A second resistor has a respective first terminal, which is connected to the control terminal of the second load transistor, and a respective second terminal, which is connected to the second node and to the control terminal of the second output transistor.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
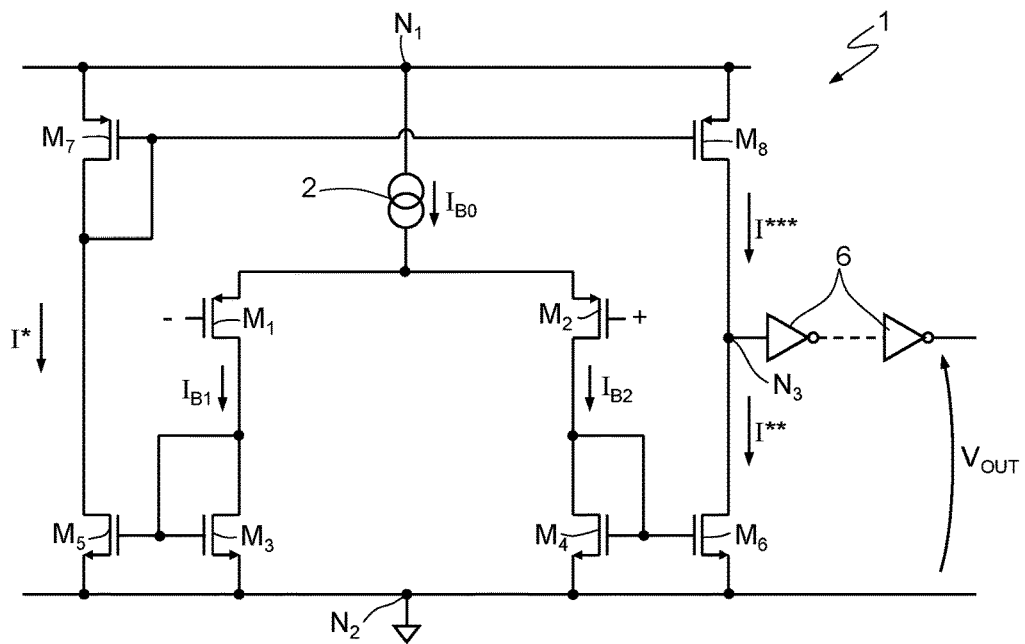
FIGS. 1 and 2 show circuit diagrams of comparator circuits of a known type.
Figure 2:
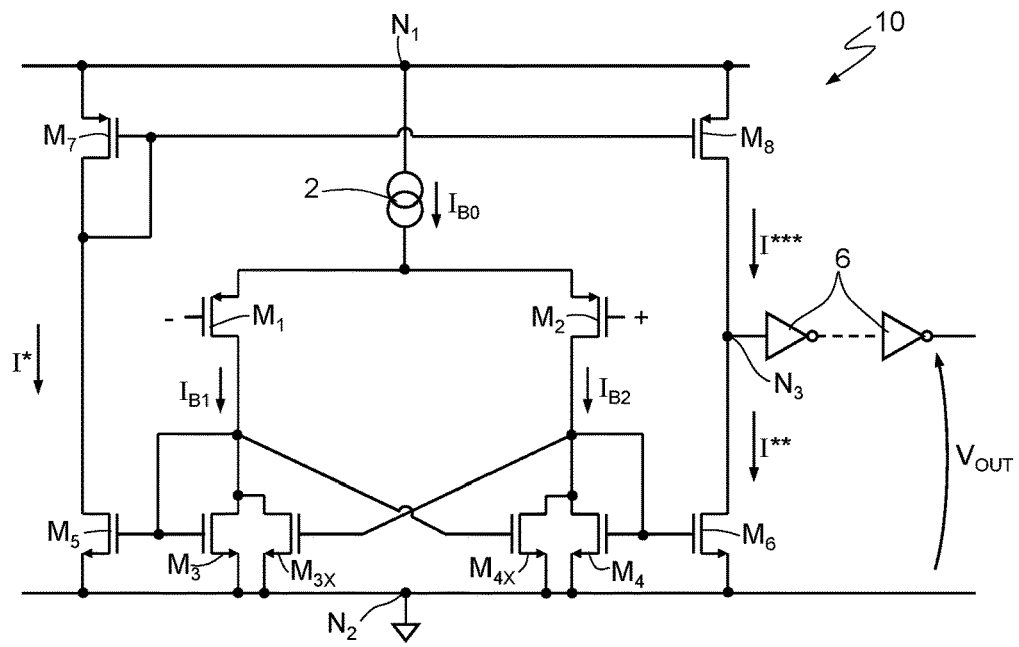
Figure 3:
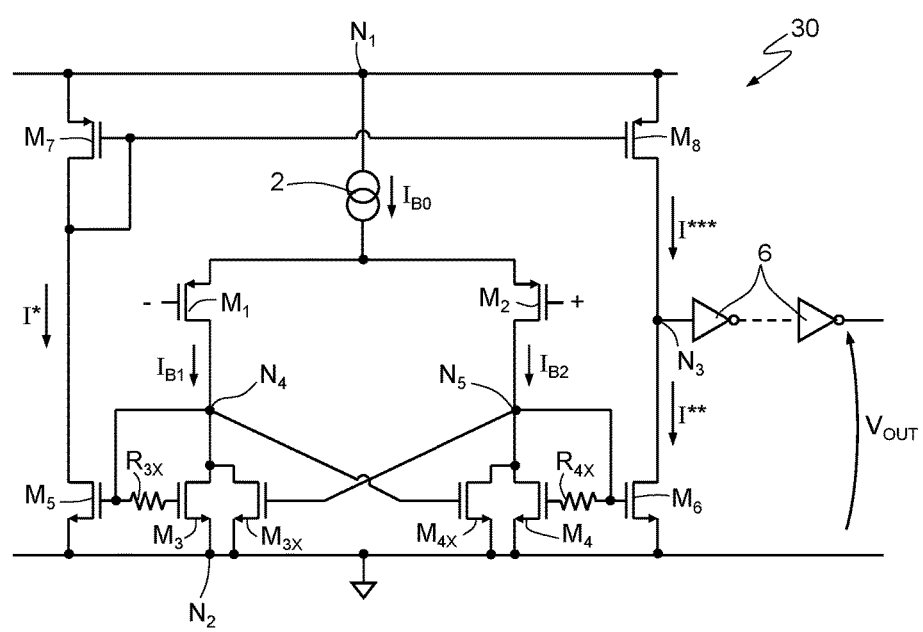
FIG. 3 shows a circuit diagram of an embodiment of the present continuous-time comparator circuit.

FIG. 3 shows a comparator circuit 30, which is described in what follows limitedly to the differences with respect to the comparator circuit 10 illustrated in FIG. 2. Further, components of the comparator circuit 30 already present in the comparator circuit 10 are designated by the same references. There thus apply the relations of equality between the transistors mentioned with reference to the comparator circuit 10, and thus the relations of equality mentioned with reference to the comparator circuit 1. In addition, it is assumed that the relation $W/L_{(M3,M4)} > W/L_{(M3X,M4X)}$ applies.

In detail, the comparator circuit 30 comprises a first resistor $R_{3X}$ and a second resistor $R_{4X}$, which substantially have one and the same resistance, this resistance being higher than or equal to 100 k$\Omega$ and preferably lower than 1000 k$\Omega$.

In greater detail, a first terminal of the first resistor $R_{3X}$ is connected to the gate terminal of the third MOSFET $M_3$, whereas a second terminal of the first resistor $R_{3X}$ is connected to the gate terminal of the fifth MOSFET $M_5$, to the drain terminals of the first and third MOSFETs $M_1$, $M_3$ and to the gate terminal of the second feedback MOSFET $M_{4X}$, as well as to the drain terminal of the first feedback MOSFET $M_{3X}$. In FIG. 3, the node formed by the gate terminals of the fifth MOSFET $M_5$ and of the second feedback MOSFET $M_{4X}$, as well as by the drain terminals of the first feedback MOSFET $M_{3X}$ and of the first and third MOSFETs $M_1$, $M_3$, is designated by $N_4$ and referred to as the fourth node $N_4$.

Likewise, a first terminal of the second resistor $R_{4X}$ is connected to the gate terminal of the fourth MOSFET $M_4$, whereas a second terminal of the second resistor $R_{4X}$ is connected to the gate terminal of the sixth MOSFET $M_6$, to the drain terminals of the second and fourth MOSFETs $M_2$, $M_4$ and of the second feedback MOSFET $M_{4X}$, as well as to the gate terminal of the first feedback MOSFET $M_{3X}$. In FIG. 3, the node formed by the gate terminals of the sixth MOSFET $M_6$ and of the first feedback MOSFET $M_{3X}$, as well as by the drain terminals of the second feedback MOSFET $M_{4X}$ and of the second and fourth MOSFETs $M_2$, $M_4$, is designated by $N_5$ and referred to as the fifth node $N_5$.

The first and second resistors $R_{3X}$, $R_{4X}$ form, respectively, with the gate capacitances of the third and fourth MOSFETs $M_3$, $M_4$, corresponding circuits of an RC type, which are characterized by a first time constant, which determines the speed at which the aforementioned negative-feedback mechanism is set up, this speed being lower than in the case of the comparator circuit 10 represented in FIG. 2.

As regards the speed of setting-up of the positive-feedback mechanism, it depends upon a second time constant, which, not being determined by the resistances of the first and second resistors $R_{3X}$, $R_{4X}$, but only by the first and second feedback MOSFETs $M_{3X}$, $M_{4X}$, is shorter than the first time constant.

Operatively, following upon the crossing time and the subsequent variation of the input signal, which is present (for example) on the gate terminal of the first MOSFET $M_1$, intervention of the negative feedback caused by the presence of the third and fourth MOSFETs $M_3$, $M_4$ is delayed with respect to intervention of the positive feedback caused by the presence of the first and second feedback MOSFETs $M_{3X}$, $M_{4X}$. It follows that, during a first time interval, subsequent to the crossing time, there is present, to a first approximation, just the positive feedback. Consequently, the comparator circuit 30 behaves like a latched comparator and thus presents very short decision times; i.e., it is characterized by a fast switching of the voltage on the third node $N_3$ (from a low value to a high value, or vice versa); the first time interval is comparable with the first time constant. Then, also the negative feedback is set up, which prevails over the positive feedback and induces a sort of reset of the comparator circuit 30, which thus becomes ready to detect new crossings, by the input signal, of the voltage level represented by the reference voltage.

From what has been described and illustrated previously, the advantages that the present solution affords emerge clearly.

In particular, the present comparator circuit is of a continuous-time type, but exhibits performance, in terms of resolution and speed, comparable with that of a clock-triggered comparator, albeit without requiring any reset, thus enabling a continuous monitoring of the input signal. More in particular, it may be shown how the switching time that elapses between the crossing time and the subsequent switching of the voltage present on the third node $N_3$ decreases as the resistance value of the first and second resistors $R_{3X}$, $R_{4X}$ increases.

In conclusion, it is clear that modifications and variations may be made to what has been described and illustrated herein, without thereby departing from the scope of the present disclosure, as defined in the annexed claims.

For instance, the transistors may be of a type different from what has been described.

As mentioned previously, the number of the inverters 6 may be any and they may even be absent.

It is further possible for the currents $I_{B1}$, $I_{B2}$ to be generated in a way other than with the use of a differential pair. In this connection, in general the fourth and fifth nodes $N_4$, $N_5$ form a pair of input nodes designed to receive a non-zero differential current signal.

Finally, the comparator circuit may be different from what has been illustrated. In particular, it is possible for it to be such that the relation between the voltage on the third node $N_3$ and the currents I* and I** is different from what has been described. More in general, embodiments are possible that differ from what has been illustrated but in which once again the voltage on the third node $N_3$ is found to vary for increasing as one of the currents I* and I** increases and to decrease as the other increases. Even more in general, embodiments are possible in which, irrespective of the possible presence of the inverters 6 and their type, the preliminary output signal is not of a single-ended type, as in the case illustrated in FIG. 3, but of a differential type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A continuous-time comparator circuit, comprising:
   a first node and a second node configured to receive, respectively, a first current and a second current which form a differential signal;
   a first current mirror including a first load transistor having a control terminal and a conduction terminal, and a first output transistor having a respective control terminal, the conduction terminal of the first load transistor being connected to the first node, said first output transistor being configured to be traversed by a first mirrored current that is a function of the first current;
   a second current mirror including a second load transistor having a respective control terminal and a respective conduction terminal, and a second output transistor having a respective control terminal, the conduction terminal of the second load transistor being connected to the second node, said second output transistor being configured to be traversed by a second mirrored current that is a function of the second current;
   a first feedback transistor having a respective conduction terminal and a respective control terminal, which are connected to said first node and to said second node, respectively;
   a second feedback transistor having a respective conduction terminal and a respective control terminal, which are connected to said second node and to said first node, respectively;
   output circuitry electrically coupled to the first and second output transistors and configured to generate an output signal that switches between a first value and a second value as a function of said first and second mirrored currents;
   a first resistor having a first terminal connected to the control terminal of the first load transistor, and a second terminal connected to the first node and to the control terminal of the first output transistor; and a second resistor having a respective first terminal connected to the control terminal of the second load transistor, and a respective second terminal connected to the second node and to the control terminal of the second output transistor.

2. The continuous-time comparator circuit according to claim 1, wherein each one of the first resistor and the second resistor has a resistance greater than or equal to 100 kΩ.

3. The continuous-time comparator circuit according to claim 1, wherein said output circuitry forms an output node and is configured to vary a voltage present on said output node as a function of the difference between said first and second mirrored currents.

4. The continuous-time comparator circuit according to claim 3, wherein each of said first and second output transistors has a respective conduction terminal; and wherein said output circuitry comprises a third current mirror electrically coupled to the conduction terminals of the first and second output transistors and to said output node.

5. The continuous-time comparator circuit according to claim 3 further comprising at least one inverter having an input connected to said output node.

6. The continuous-time comparator circuit according to claim 1 further comprising a differential pair including a first input transistor and a second input transistor, each of which has a respective conduction terminal and a respective control terminal; and wherein one of the control terminals of the first and second input transistors is configured to be set at a reference voltage, the other terminal being configured to receive an input signal; and wherein the respective conduction terminals of the first and second input transistors are connected to the first and second input nodes, respectively.

7. The continuous-time comparator circuit according to claim 1, wherein said first and second load transistors, said first and second output transistors, and said first and second feedback transistors are MOSFETs.

8. A comparator circuit, comprising:
an input circuit coupled to receive first and second input signals and configured to provide first and second current signals to first and second input nodes, respectively, based on the first and second input signals;
a first current mirror including a first load transistor coupled to the first input node and including a first output transistor configured to generate a first mirrored current based on the first current signal, the first current mirror including a first resistive circuit to set a constant associated with the first load transistor to a first time constant value;
a first feedback transistor including a conduction node coupled to the first input node and a control node coupled to the second input node, a second time constant being associated with the first feedback transistor where the second time constant has a second time constant value that is less than the first time constant value;
a second current mirror including a second load transistor coupled to the second input node and including a second output transistor configured to generate a second mirrored current based on the second current signal, the second current mirror including a second resistive circuit to set a time constant associated with the second load transistor to the first time constant value;
a second feedback transistor including a conduction node coupled to the second input node and a control node coupled to the first input node, the second time constant being associated with the second feedback transistor; and
output circuitry coupled to the first and second output transistors and configured to generate an output signal based on the first and second mirrored currents.

9. The comparator circuit of claim 8, wherein the input circuit comprises a differential pair of transistors.

10. The comparator circuit of claim 8, wherein the output circuitry is coupled to an output node and is configured to control a voltage on the output node based on a difference between the first and second mirrored currents.

11. The comparator circuit of claim 10, wherein the output circuitry comprises a third output transistor in a diode-coupled configuration, the third output transistor coupled to the first output transistor and the output circuitry further including a fourth output transistor coupled to the third output transistor and to the output node.

12. The comparator circuit of claim 11 further comprising a plurality of series-connected inverters, an input of a first one of the plurality of series-connected inverters coupled to the output node.

13. The comparator of claim 8, where each of the transistors comprises a MOSFET.

14. The comparator of claim 8, wherein each of the first and second load transistors has a width-to-length ratio W/L for a channel of the transistor and each of the first and second feedback transistors has a width-to-length ratio for a channel of the transistor, and wherein the width to length ratio for the first and second load transistors is great then the width to length ration for the first and second feedback transistors.

15. The comparator circuit of claim 8 wherein each of the first and second resistive circuits comprises a resistor having a resistance value that is greater than or equal to approximately 100 kΩ.

16. A method of comparing first and second input signals, the method comprising:
providing a first current to a first input node based on the first input signal;
providing a second current to a second input node based on the second input signal;
controlling a voltage on the first input node through a negative-feedback mechanism based upon the first current, the negative-feedback mechanism having an associated first time constant;
controlling a voltage on the second input node through the negative-feedback mechanism based upon the second current;
controlling the voltage on the first input node through a positive-feedback mechanism based upon the voltage on the second input node, the positive-feedback mechanism having an associated second time constant that is less than the first time constant;
controlling the voltage on the second input node through the positive-feedback mechanism based on the voltage on the first input node;
generating first and second mirrored current based on the first and second currents, respectively; and
generating an output signal based on the first and second mirrored currents.

17. The method of claim 16, wherein generating the output signal based on the first and second mirrored currents comprises generating the output signal based on a difference between the first and second mirrored currents.

18. The method of claim 16, wherein controlling the voltages on the first and second input nodes through the positive-feedback mechanism comprises controlling the voltages through a pair of cross-coupled transistors coupled to the first and second input nodes.

19. The method of claim 16, wherein controlling the voltages on the first and second input nodes through the negative-feedback mechanism comprises providing the first and second currents to first and second diode-coupled load transistors coupled to the first and second input nodes, respectively.

\* \* \* \* \*